(12) United States Patent
Miura

(10) Patent No.: US 8,624,703 B2
(45) Date of Patent: Jan. 7, 2014

(54) SEMICONDUCTOR CERAMIC ELEMENT AND METHOD FOR PRODUCING SAME

(71) Applicant: Murata Manufacturing Co., Ltd., Nagaokakyo (JP)

(72) Inventor: Tadamasa Miura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/794,852

(22) Filed: Mar. 12, 2013

(65) Prior Publication Data

US 2013/0200989 A1    Aug. 8, 2013

Related U.S. Application Data

(63) Continuation of application No. PCT/JP2011/069017, filed on Aug. 24, 2011.

(30) Foreign Application Priority Data

Sep. 14, 2010  (JP) .................................. 2010-205099

(51) Int. Cl.
*H01C 7/10*  (2006.01)
(52) U.S. Cl.
USPC ...................................... 338/22 SD; 338/22 R
(58) Field of Classification Search
USPC ...................................... 338/22 R, 22 SD, 13
See application file for complete search history.

(56) References Cited

U.S. PATENT DOCUMENTS

| | | | |
|---|---|---|---|
| 3,863,210 A * | 1/1975 | Roland et al. ................. | 340/450 |
| 4,702,619 A | 10/1987 | Camp et al. | |
| 5,519,374 A | 5/1996 | Schrank et al. | |
| 5,820,995 A | 10/1998 | Niimi | |
| 7,709,922 B2 * | 5/2010 | Takagi et al. ................. | 257/467 |
| 2007/0262408 A1 | 11/2007 | Takagi et al. | |

FOREIGN PATENT DOCUMENTS

| | | |
|---|---|---|
| JP | 50-003387 A | 1/1975 |
| JP | 58-069901 U | 5/1983 |
| JP | 59-174725 A | 10/1984 |
| JP | 63-75001 U | 5/1988 |
| JP | 07-167715 A | 7/1995 |
| JP | 08-306508 A | 11/1996 |
| JP | 09-180907 A | 7/1997 |
| JP | 09-180908 A | 7/1997 |
| JP | 2000-124008 A | 4/2000 |
| JP | 2005-268578 A | 9/2005 |

OTHER PUBLICATIONS

Official Communication issued in International Patent Application No. PCT/JP2011/069017, mailed on Nov. 29, 2011.
Official Communication issued in corresponding Japanese Patent Application No. 2012-533927, mailed on Aug. 27, 2013.

* cited by examiner

*Primary Examiner* — Kyung Lee
(74) *Attorney, Agent, or Firm* — Keating & Bennett, LLP

(57) ABSTRACT

A semiconductor ceramic element includes an element main body where a PTC section including a semiconductor ceramic which has PTC characteristics and an NTC section including a semiconductor ceramic which has NTC characteristics are integrated by co-firing while suppressing interdiffusion. The element main body is formed in such a way that a PTC substrate is first obtained by firing a semiconductor ceramic material to serve as the PTC section at a predetermined temperature, and a paste containing a semiconductor ceramic material to serve as the NTC section is then applied or printed on the PTC substrate, followed by co-firing at a temperature lower than the predetermined temperature.

17 Claims, 4 Drawing Sheets

○● ··· SAMPLE 6 (○: MEASUREMENT IN FORWARD DIRECTION, ●: MEASUREMENT IN REVERSE DIRECTION)
□■ ··· SAMPLE 7 (□: MEASUREMENT IN FORWARD DIRECTION, ■: MEASUREMENT IN REVERSE DIRECTION)
△▲ ··· SAMPLE 8 (△: MEASUREMENT IN FORWARD DIRECTION, ▲: MEASUREMENT IN REVERSE DIRECTION)

SEMICONDUCTOR CERAMIC ELEMENT AND METHOD FOR PRODUCING SAME

BACKGROUND OF THE INVENTION

1. Field of the Invention

The present invention relates to a semiconductor ceramic element and a method for producing the semiconductor ceramic element, and more particularly, to a semiconductor ceramic element which has combined electrical characteristics including PTC characteristics and NTC characteristics, and a method for producing the semiconductor ceramic element.

2. Description of the Related Art

Typical applications of thermistors include temperature sensors. Temperature sensors using thermistors have different resistance-temperature characteristics required depending on the applications, and thus, there has been a need for the temperature sensors to have an ability to provide a variety of resistance-temperature characteristics. For example, Japanese Utility Model Application Laid-Open No. 63-75001 or Japanese Patent Application Laid-Open No. 7-167715 proposes a thermistor temperature sensor which has a PTC element and an NTC element combined in order to develop required resistance-temperature characteristics.

While there is a possibility that various resistance-temperature characteristics will be achieved when the PTC element and the NTC element are combined as described above, the PTC element and the NTC element are not able to simply have a structure with the elements bonded to each other with a common electrode interposed therebetween when attention is drawn to the bonded section between the PTC element and the NTC element. This is because the reliability of the junction may be decreased in some cases, or the electrode material which can make ohmic contact with the PTC element and the electrode material which can make ohmic contact with the NTC element may be different from each other in some cases.

Therefore, in Japanese Utility Model Application Laid-Open No. 63-75001, a structure which has electrodes respectively provided on a PTC element and an NTC element and bonded to each other is used. However, the use of this structure increases the number of sections for bonding different elements, such as the bonded section between one electrode and the other electrode, the bonded section between the PTC element and the electrode, and the bonded section between the NTC element and the electrode, which increases the probability of peeling at the bonded sections.

On the other hand, in Japanese Patent Application Laid-Open No. 7-167715, a structure which has a PTC element and an NTC element bonded to each other simply with one common electrode is used. However, this common electrode has to be made of a special material such as a material which guarantees the contact of temperature-dependant resistance by barrier layer destruction, and forms a diffusion barrier against interdiffusion of each of the sections constituting the thus contacted temperature-dependant resistance into the other temperature-dependant resistance. In addition, Japanese Patent Application Laid-Open No. 7-167715 also fails to prevent the problem of peeling as in the case of Japanese Utility Model Application Laid-Open No. 63-75001, as long as there is any electrode at the bonded section between the PTC element and the NTC element.

SUMMARY OF THE INVENTION

Therefore, preferred embodiments of the present invention provide a semiconductor ceramic element and a method for producing the semiconductor ceramic element, which can solve the problems described above.

A semiconductor ceramic element according to a preferred embodiment of the present invention is, briefly speaking, achieved by integrally forming a PTC section including a semiconductor ceramic which has PTC characteristics and an NTC section including a semiconductor ceramic which has NTC characteristics. However, even when the semiconductor ceramic which has PTC characteristics and the semiconductor ceramic which has NTC characteristics are subjected to co-firing, interdiffusion is caused, and it is thus conceivable that combined electrical characteristics of PTC characteristics and NTC characteristics will not be achieved.

The present inventor has discovered, as a result of making a great deal of earnest consideration in order to solve the problem of interdiffusion which can prevent the development of combined electrical characteristics, that, for example, when a paste containing a semiconductor ceramic material to serve as a semiconductor ceramic which has NTC characteristics is applied or printed on a PTC substrate after first obtaining the PTC substrate by firing at a predetermined temperature, a semiconductor ceramic material to serve as a semiconductor ceramic which has PTC characteristics, and then subjected to co-firing at a temperature lower than the predetermined temperature, it is possible to cause almost no interdiffusion between the semiconductor ceramic section which has PTC characteristics and the semiconductor ceramic section which has NTC characteristics, and an element can be formed which has combined characteristics including PTC characteristics and NTC characteristics. Furthermore, it has been confirmed that when an n-type semiconductor and a p-type semiconductor are selected respectively for the semiconductor ceramic which has PTC characteristics and the semiconductor ceramic which has NTC characteristics, a pn junction can be formed, and an element which has a rectifying property can be formed.

More specifically, a semiconductor ceramic element according to a preferred embodiment of the present invention includes an element main body including a PTC section including a semiconductor ceramic which has PTC characteristics and an NTC section including a semiconductor ceramic which has NTC characteristics, the PTC section and the NTC section directly contacting each other with a bonded interface interposed therebetween; a first electrode arranged on an outer surface of the element main body so as to contact with the PTC section; and a second electrode arranged on the outer surface of the element main body so as to contact with the NTC section, wherein the semiconductor ceramic element has combined electrical characteristics including PTC characteristics and NTC characteristics.

In the semiconductor ceramic element according to a preferred embodiment of the present invention, preferably, the PTC section preferably includes a $BaTiO_3$-based oxide and the NTC section preferably includes a Mn-based spinel-type oxide, for example. In this case, a Ti interdiffusion distance and a Mn interdiffusion distance at a bonded interface between the PTC section and the NTC section are preferably both about 50 μm or less, for example.

A semiconductor ceramic element according to another preferred embodiment of the present invention includes an element main body including a thick film including a semiconductor ceramic material defining a second conduction-type semiconductor ceramic is disposed on a fired substrate that has been fired at a first temperature, a semiconductor ceramic material defining a first conduction-type semiconductor ceramic that has been fired at a second temperature lower than the first temperature, a semiconductor ceramic which has PTC characteristics is one of the first and second conduction-type semiconductor ceramics and a semiconductor ceramic which has NTC characteristics is the other of the first and second conduction-type semiconductor ceramics; a first electrode arranged on an outer surface of the element main body so as to contact with the substrate, and a second electrode arranged on the outer surface of the element main body so as to contact with the thick film, wherein the semiconductor ceramic element has combined electrical characteristics including PTC characteristics and NTC characteristics.

According to yet another preferred embodiment of the present invention, a method for producing a semiconductor ceramic element includes the steps of obtaining a substrate by firing at a first temperature a semiconductor ceramic material to serve as a first conduction-type semiconductor ceramic; forming on the substrate a thick film including a semiconductor ceramic material to serve as a second conduction-type semiconductor ceramic; and firing the thick film at a second temperature lower than the first temperature, wherein a semiconductor ceramic which has PTC characteristics is one of the first and second conduction-type semiconductor ceramics and a semiconductor ceramic which has NTC characteristics is the other of the first and second conduction-type semiconductor ceramics.

In the method for producing the semiconductor ceramic element according to a preferred embodiment of the present invention, preferably, the first conduction-type semiconductor ceramic includes a BaTiO$_3$-based oxide, whereas the second conduction-type semiconductor ceramic includes a Mn-based spinel-type oxide, and the second temperature is lower than the first temperature by about 150° C. or more, for example.

In the semiconductor ceramic element according to various preferred embodiments of the present invention, the element main body includes the PTC section and NTC section directly contacting each other with the bonded interface interposed therebetween. As a result, the problem of peeling at the bonded section is significantly reduced and prevented. In addition, there is no need to interpose any electrode between the PTC section and the NTC section, and the cost associated with the electrode formation can thus be significantly reduced.

In addition, the semiconductor ceramic element according to various preferred embodiments of the present invention achieves combined electrical characteristics including PTC characteristics and NTC characteristics, and can thus be changed in resistance-temperature characteristics, depending on the selection of the material for the semiconductor ceramic which has PTC characteristics, and depending on the selection of the material for the semiconductor ceramic which has NTC characteristics, solely or collectively. Therefore, the selection of these materials makes it possible to achieve various resistance-temperature characteristics.

In addition, the semiconductor ceramic element according to various preferred embodiments of the present invention can utilize a first conduction method of applying an electric current in a direction in which the PTC section and the NTC section are connected in series, or a second conduction method of applying an electric current in a direction in which the PTC section and the NTC section are connected in parallel, and the first conduction method can provide characteristics from the NTC section before steeply increasing resistance-temperature characteristics from the PTC section. As a result, it becomes possible to detect temperatures with a high degree of accuracy in a temperature range before steeply increasing resistance-temperature characteristics from the PTC section appear.

On the other hand, the second conduction method can adjust the resistance-temperature characteristics so that PTC characteristics are dominant until a rise in the resistance of the PTC section occurs, whereas characteristics from the NTC section appear after the rise in the resistance of the PTC section.

In addition, the semiconductor ceramic element according to various preferred embodiments of the present invention includes a pn junction located at the bonded interface where the PTC section and the NTC section are in direct contact with each other, and thus, when an electric current is applied in a direction in which the PTC section and the NTC section are connected in series, diode characteristics can be developed which produce barrier resistance in a forward direction and its reverse direction.

In the method for producing a semiconductor ceramic element according to a preferred embodiment of the present invention, the substrate is first obtained by firing at the first temperature the semiconductor ceramic material to serve as the first conduction-type semiconductor ceramic, then, the thick film including the semiconductor ceramic material to serve as the second conduction-type semiconductor ceramic is formed on the substrate, and the thick film is subjected to firing at the second temperature lower than the first temperature. Thus, in the firing step, interdiffusion of elements can be made less likely to be caused between the semiconductor ceramic which has PTC characteristics and the semiconductor ceramic which has NTC characteristics.

Therefore, an element main body with a PTC section and an NTC section directly bonded to each other can be achieved without damaging various characteristics including the semiconductor ceramic which has PTC characteristics and the semiconductor ceramic which has NTC characteristics. As a result, a semiconductor ceramic element can be produced which has combined electrical characteristics including PTC characteristics and NTC characteristics.

In the method for producing a semiconductor ceramic element according to a preferred embodiment of the present invention, the first conduction-type semiconductor ceramic including a BaTiO$_3$-based oxide, the second conduction-type semiconductor ceramic including a Mn-based spinel-type oxide, and the second temperature of being lower than the first temperature by about 150° C. or more, can ensure that the Ti interdiffusion distance and the Mn interdiffusion distance at the bonded interface between the PTC section and the NTC section are about 50 µm or less, for example.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
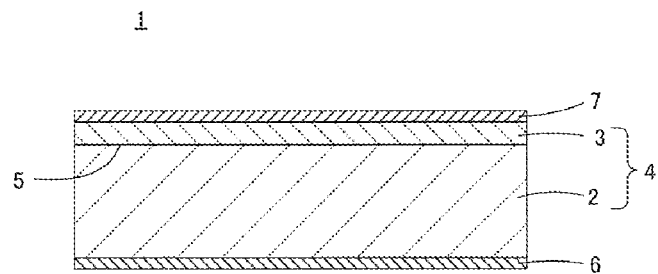
FIG. 1 is a cross-sectional view illustrating a semiconductor ceramic element 1 according to a first preferred embodiment of the present invention.

The structure of a semiconductor ceramic element 1 according to a first preferred embodiment of the present invention will be described with reference to FIG. 1.

The semiconductor ceramic element 1 preferably includes an element main body 4 including a PTC substrate 2 including an n-type semiconductor ceramic which has PTC characteristics, and an NTC thick film 3 disposed on the PTC substrate 2 and including a p-type semiconductor ceramic which has NTC characteristics. The element main body 4 includes the PTC substrate 2 and the NTC thick film 3 integrated in direct contact with each other with a bonded interface 5 interposed therebetween.

The PTC substrate 2 preferably includes a $BaTiO_3$-based oxide, for example, containing at least $BaTiO_3$, if necessary, containing at least one of Sr and Pb, and further containing at least one selected from Mn, Si, La, Er, Sn, and Nd in minute amounts. The NTC thick film 3 preferably includes, for example, a spinel-type oxide containing at least one transition metal of Mn, Co, Fe, Ni, Ti, Cu, Zn, and Al, and preferably includes a Mn-based spinel-type oxide.

For example, when the PTC substrate 2 includes a $BaTiO_3$-based oxide, whereas the NTC thick film 3 includes a Mn-based spinel-type oxide, a Ti interdiffusion distance and a Mn interdiffusion distance at the bonded interface 5 between the PTC substrate 2 and the NTC thick film 3 are preferably both about 50 µm or less in terms of development of desired characteristics, for example. The achievement of this interdiffusion at the bonded interface 5 is closely related to a production method described below.

The semiconductor ceramic element 1 preferably further includes a first electrode 6 arranged on one principal surface of the element main body 4 so as to contact the PTC substrate 2, and a second electrode 7 arranged on the other principal surface of the element main body 4 so as to contact with the NTC thick film 3. The conductive component of the first electrode 6 is provided by a metal which can make ohmic contact with the PTC substrate 2, for example, InGa or Ni. On the other hand, the conductive component of the second electrode 7 is provided by a metal which can make ohmic contact with the NTC thick film 3, for example, a single element of Ag, Pt, or Pd, or an alloy thereof.

In the semiconductor ceramic element 1, when current is applied to the element main body 4 across the first and second electrodes 6 and 7 mentioned above, an electric current flows in a direction in which the PTC substrate 2 and the NTC thick film 3 are connected in series.

Next, a non-limiting example of a method for producing the semiconductor ceramic element 1 will be described.

First, the PTC substrate 2 is prepared in the following way. For example, in the case of preparing the PTC substrate 2 including a $BaTiO_3$-based oxide, more specifically, respective powders such as $BaCO_3$, $SrCO_3$, $CaCO_3$, $TiO_2$, $Y_2O_3$, $SiO_2$, and $MnCO_3$ are prepared as ceramic raw materials, and these powders are each weighed in predetermined amounts, then put into a ball mill along with grinding media such as zirconia and subjected to sufficient wet grinding, and subsequently, subjected to a calcination treatment to prepare a PTC ceramic powder.

Next, the PTC ceramic powder is subjected to a mixing treatment in a wet way with the addition of an organic binder to the powder, thereby providing a slurry, then, this slurry is formed into sheets with the use of a doctor blade method or the like, and the obtained sheets are stacked up to an appropriate number of times, and subjected to pressure bonding for each stacking to prepare a raw block of a PTC ceramic.

Then, this raw block is cut into a predetermined size, then housed in a zirconia sagger, subjected to a binder removal treatment, and then subjected to a firing treatment at a predetermined temperature to obtain the PTC substrate 2.

Respective powders such as $Mn_3O_4$, NiO, $Co_3O_4$, CuO, $Fe_2O_3$, $TiO_2$, and $Al_2O_3$ are prepared as ceramic raw materials for the NTC thick film 3, and these powders are each weighed in predetermined amounts, then put into a ball mill along with grinding media such as zirconia and subjected to sufficient wet grinding, and subsequently, subjected to a calcination treatment to prepare an NTC ceramic powder.

Next, the NTC ceramic powder is subjected to a mixing treatment in a wet way with the addition of an organic binder to the powder, thereby providing a slurry, and this slurry is applied on one principal surface of the PTC substrate with the use of, for example, a spin coating method or a screen printing method to form a raw NTC thick film 3.

Next, the PTC substrate 2 with the raw NTC thick film 3 formed thereon is housed in a zirconia sagger, subjected to a binder removal treatment, and then subjected to a firing treatment at a predetermined temperature to obtain the sintered NTC thick film 3, and obtain the element main body 4 of the PCT substrate 2 and NTC thick film 3 integrated. The temperature applied in this firing step is made lower than the temperature for firing the PTC substrate 2. This selection of the firing temperatures significantly reduces and prevents interdiffusion between the PTC substrate 2 and the NTC thick film 3, thereby making it possible to develop combined characteristics of PTC characteristics from the PTC substrate 2 and NTC characteristics from the NTC thick film 3.

When the PTC substrate 2 includes a $BaTiO_3$-based oxide, whereas the NTC thick film 3 includes a Mn-based spinel-type oxide, the firing temperature for obtaining the NTC thick film 3, which is lower than the firing temperature for obtaining the PTC substrate 2 by about 150° C. or more, for example, ensures that the Ti interdiffusion distance and the Mn interdiffusion distance at the bonded interface 5 between the PTC substrate 2 and the NTC thick film 3 are both suppressed to about 50 μm or less, for example, and thus ensures that combined characteristics are developed which have PTC characteristics from the PTC substrate 2 and NTC characteristics from the NTC thick film 3. It is to be noted that the preferred difference in temperature, such as, at least about 150° C. as mentioned above, varies depending on the respective materials of the PTC substrate 2 and NTC thick film 3.

Then, for example, an Ag paste is applied on the NTC thick film 3 side of the element main body 4, and subjected to a baking treatment to form the second electrode 7, and if necessary, the element main body 4 with the second electrode 7 formed thereon is cut into a predetermined size, and subsequently, for example, InGa is applied on the PTC substrate 2 side of the element main body 4 to form the first electrode 6.

The semiconductor ceramic element 1 shown in FIG. 1 is preferably completed in the manner described above. Properties provided by this semiconductor ceramic element 1 will be described below.

Figure 3:
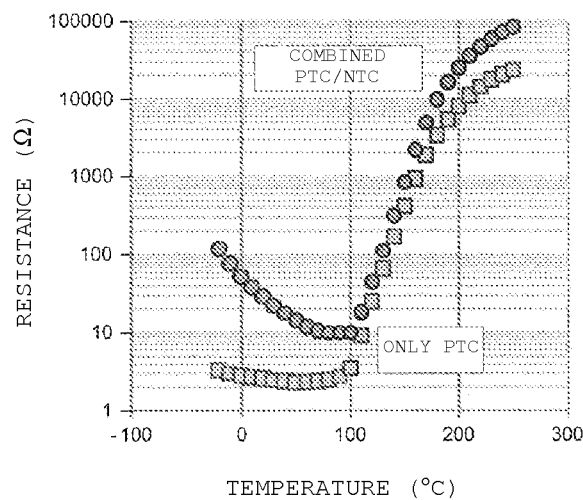
FIG. 3 is a diagram for illustrating characteristics achieved by a semiconductor ceramic element which has a structure with a PTC section and an NTC section combined according to a preferred embodiment of the present invention, where resistance-temperature characteristics in the case of applying an electric current in a direction in which a PTC substrate and an NTC thick film are connected in series for an element main body according to a sample 1 prepared in an experimental example are compared with resistance-temperature characteristics for an element main body composed of only a PTC substrate as a comparative example.

FIG. 3 shows resistance-temperature characteristics of the semiconductor ceramic element 1 with an expression of "COMBINED PTC/NTC". It is to be noted that the characteristics shown in FIG. 3 correspond to an element main body according to a sample 1 prepared in an experimental example described below. FIG. 3 further shows resistance-temperature characteristics for an element main body composed of only a PTC substrate as a comparative example, with an expression of "ONLY PTC".

As can be seen from a comparison between "COMBINED PTC/NTC" and "ONLY PTC" in FIG. 3, the semiconductor ceramic element 1 can provide NTC characteristics from the NTC thick film before steeply increasing resistance-temperature characteristics from the PTC substrate 2. The provided NTC resistance-temperature characteristics have a B constant of 3100 K, which is extremely high as compared with the temperature coefficient 250 K of the PTC resistance-temperature characteristics, and the 3 CV indicating the variation in resistance value is, at 25° C., 5% for NTC, and on the other hand, high and 20% for PTC, for example, among 10 pieces of measurement data. From the foregoing, it is determined that it is possible to detect temperatures with a high degree of accuracy, for one element, in a temperature range before steeply increasing resistance-temperature characteristics with the PTC, through the addition of NTC characteristics. In addition, it is possible to easily adjust the temperature coefficient and the resistance value of the NTC with the use of characteristics from the NTC material selected.

Figure 4:
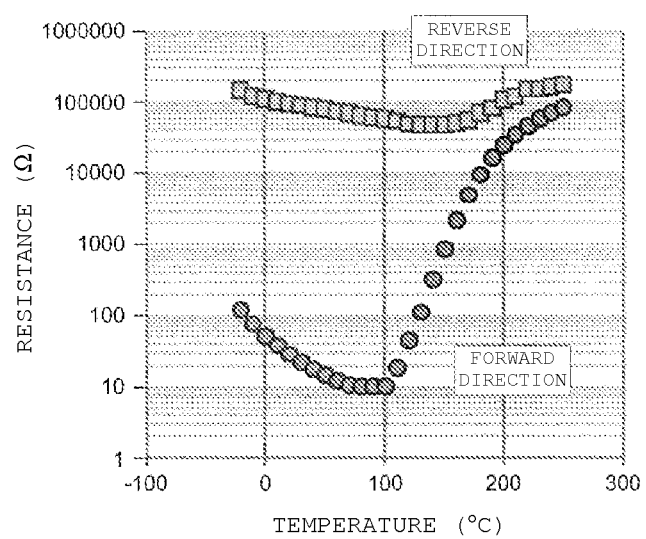
FIG. 4 is a diagram for illustrating characteristics of a semiconductor ceramic element according to a preferred embodiment of the present invention, where resistance-temperature characteristics in the case of applying an electric current in a direction in which the PTC substrate and the NTC thick film are connected in series for the element main body according to the sample 1 are compared in the case of forward electric current and in the case of reverse electric current.

FIG. 4 shows resistance-temperature characteristics of the semiconductor ceramic element 1, which are compared in the case of forward electric current and in the case of reverse electric current. It is to be noted that the characteristics shown in FIG. 4 correspond to the element main body according to the sample 1 prepared in the experimental example. Therefore, the characteristics shown with an expression of "FORWARD DIRECTION" in FIG. 4 correspond to the characteristics shown with the expression of "COMBINED PTC/NTC" in FIG. 3.

As can be seen from FIG. 4, the semiconductor ceramic element 1 can develop diode characteristics which have barrier resistance produced in the forward direction and the reverse direction. This is because a pn junction is provided at the bonded interface 5 with the PTC substrate 2 and the NTC thick film 3 in direct contact with each other. These types of diode characteristics can be also confirmed, of course, in the case of voltage-electric current characteristics, as shown in FIG. 5.

Figure 5:
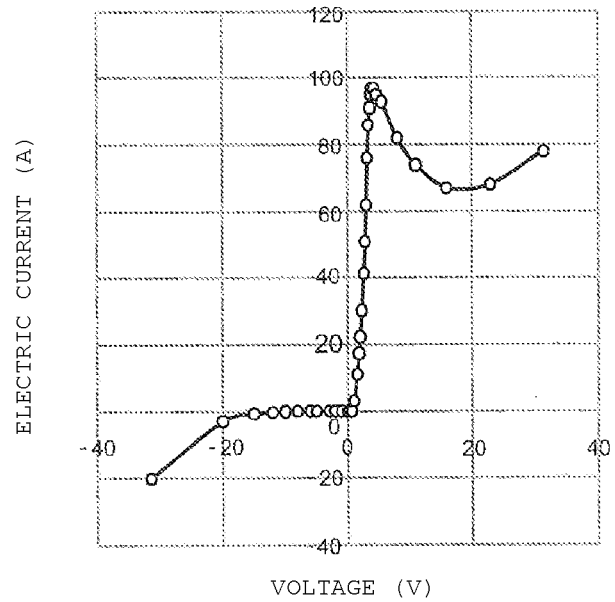
FIG. 5 is a diagram for illustrating characteristics of a semiconductor ceramic element according to a preferred embodiment of the present invention, and showing voltage-electric current characteristics in the case of applying an electric current in a direction in which the PTC substrate and the NTC thick film are connected in series for the element main body according to the sample 1.

FIG. 5 shows voltage-electric current characteristics for the semiconductor ceramic element 1, that is, the element main body according to the sample 1 prepared in the experimental example.

As can be seen from FIG. 5, the semiconductor ceramic element 1 produces, in addition to typical diode characteristics, a peak on the voltage-electric current characteristics by the performance of PTC.

Figure 2:
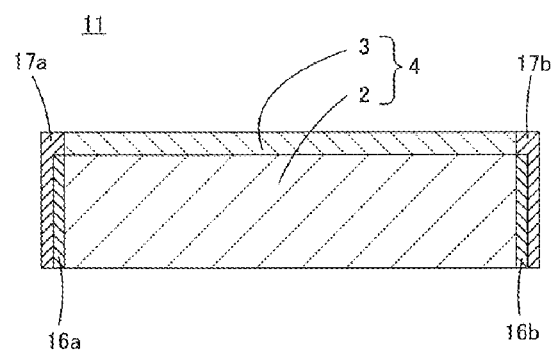
FIG. 2 is a cross-sectional view illustrating a semiconductor ceramic element 11 according to a second preferred embodiment of the present invention.

Next, the structure of a semiconductor ceramic element according to a second preferred embodiment of the present invention will be described with reference to FIG. 2. In FIG. 2, elements corresponding to the elements shown in FIG. 1 are denoted by like reference numerals, and the repeated descriptions of the elements will be omitted.

The semiconductor ceramic element 11 includes, as in the case of the semiconductor ceramic element 1, an element main body 4 including a PTC substrate 2 and an NTC thick film 3, with the PTC substrate 2 and NTC thick film 3 integrated in direct contact with each other with a bonded interface 5 interposed therebetween. The semiconductor ceramic element 11 differs from the semiconductor ceramic element 1 in terms of electrode formation, as described below.

First electrodes 16a and 16b are respectively provided on respective end surfaces of the PTC substrate 2. On the other hand, second electrodes 17a and 17b are respectively arranged to contact with respective ends of the NTC thick film 3 and cover the first electrodes 16a and 16b. Therefore, the first electrode 16a on one end of the element main body 4 is electrically connected to the second electrode 17a, whereas the first electrode 16b on the other end is electrically connected to the second electrode 17b.

In this type of semiconductor ceramic element 11, when current is applied to the element main body 4 across the second electrode 17a and second electrode 17b mentioned above, an electric current flows in a direction in which the PTC substrate 2 and the NTC thick film 3 are connected in parallel.

For producing the semiconductor ceramic element 11, the element main body 4 is prepared preferably by the same method as in the case of the semiconductor ceramic element 1. Then, the first electrodes 16a and 16b are formed, and the second electrodes 17a and 17b are then formed. More specifically, a Ni paste is provided on the respective end surfaces of the PTC substrate 2, and subjected to a baking treatment to form the first electrodes 16a and 16b, and an Ag paste is then provided so as to come into contact with the respective ends of the NTC thick film 3 and cover the first electrodes 16a and 16b, and subjected to a baking treatment to form the second electrodes 17a and 17b.

It is to be noted that simply, for example, InGa may be applied on the respective ends of the element main body 4 to form a common electrode for the first electrode 16a and the second electrode 17a and a common electrode for the first electrode 16b and the second electrode 17b. In this case, the InGa electrode can make ohmic contact with the PTC substrate 2, but make insufficient ohmic contact with the NTC thick film 3, which is not such a big problem. This is because, due to the intrinsically high resistance of the NTC thick film 3, and due to the parallel connection, a certain level of barrier produced between the NTC thick film 3 and the InGa electrode, if any, has a small effect.

Figure 6:
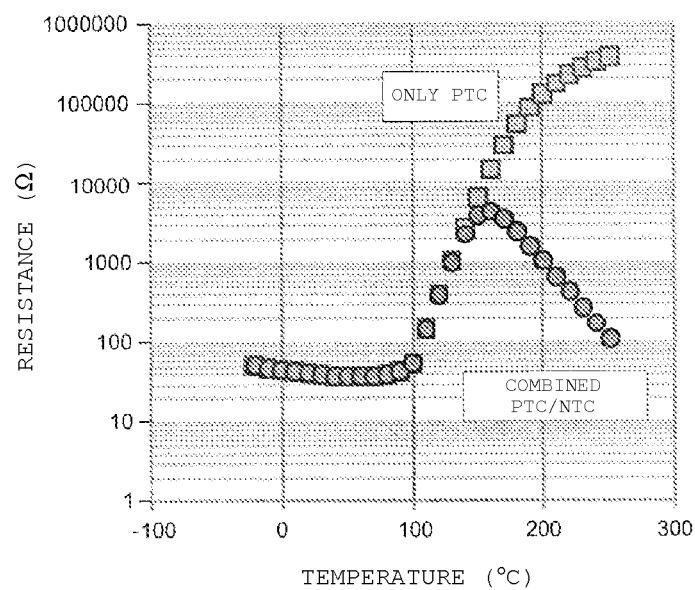
FIG. 6 is a diagram for illustrating characteristics of a semiconductor ceramic element according to a preferred embodiment of the present invention, where resistance-temperature characteristics in the case of applying an electric current in a direction in which the PTC substrate and the NTC thick film are connected in parallel for the element main body according to the sample 1 are compared with resistance-temperature characteristics for an element main body composed of only a PTC substrate as a comparative example.

FIG. 6 shows resistance-temperature characteristics of the semiconductor ceramic element 11 with an expression of "COMBINED PTC/NTC". It is to be noted that the characteristics shown in FIG. 6 were measured at a constant voltage of 5 V across electrodes formed by applying InGa on both ends of the element main body according to a sample 1 prepared in the experimental example. FIG. 6 further shows resistance-temperature characteristics measured at a constant voltage of 5 V across electrodes formed by applying InGa on both ends of an element main body composed of only a PTC substrate as a comparative example, with an expression of "ONLY PTC".

When an electric current is applied in a direction in which the PTC substrate 2 and the NTC thick film 3 are connected in parallel, PTC characteristics are dominant until a rise in PTC resistance occurs, whereas NTC resistance-temperature characteristics appear after the rise in PTC resistance occurs, as can be seen from a comparison between "COMBINED PTC/NTC" and "ONLY PTC" in FIG. 6.

While the NTC thick film 3 including a p-type semiconductor ceramic which has NTC characteristics is preferably formed on the PTC substrate 2 after the PTC substrate 2 including an n-type semiconductor ceramic which has PTC characteristics is obtained by firing in advance in the above-described preferred embodiment shown, a PTC thick film including an n-type semiconductor ceramic which has PTC characteristics may be formed on an NTC substrate after the NTC substrate including a p-type semiconductor ceramic which has NTC characteristics is obtained by firing in advance.

Next, the semiconductor ceramic element according to various preferred embodiments of the present invention will be specifically described with reference to non-limiting experimental examples.

Experimental Example 1

First, for the preparation of a PTC substrate, respective powders of $BaCO_3$, $SrCO_3$, $Er_2O_3$, $TiO_2$, and $SiO_2$ were prepared as ceramic raw materials, and these powders were weighed so as to obtain the composition of $(Ba_{0.897}Sr_{0.100}Er_{0.003})Ti_{1.010}O_3+Si_{0.020}$, then put into a ball mill along with grinding media such as zirconia and subjected to wet grinding for 24 hours, and then subjected to a calcination treatment at a temperature of 1100° C. to prepare a PTC ceramic powder.

Next, the PTC ceramic powder was subjected to a mixing treatment in a wet way with the addition of an organic binder to the powder, thereby providing a slurry, then, this slurry was formed into sheets with the use of a doctor blade method, and the obtained sheets were stacked up to a number of times for obtaining a thickness of about 500 μm after firing, and subjected to pressure bonding for each stacking to prepare a raw block of a PTC ceramic.

Then, this raw block was cut into a predetermined size, then housed in a zirconia sagger, subjected to a binder removal treatment, and then subjected to a firing treatment at a temperature of about 1350° C. as shown in the column "Firing Temperature for PTC Substrate" in Table 1, thereby obtaining a PTC substrate.

On the other hand, respective powders of $Mn_3O_4$, NiO, $Fe_2O_3$, and $TiO_2$ were prepared as ceramic raw materials for an NTC thick film, and these powders were weighed so as to obtain the composition of $(Mn_{1.95}Ni_{0.84}Fe_{0.06}Ti_{0.15})O_4$, then put into a ball mill along with grinding media such as zirconia and subjected to wet grinding for 24 hours, and subsequently, subjected to a calcination treatment at a temperature of about 800° C. to prepare an NTC ceramic powder.

Next, the NTC ceramic powder was subjected to a mixing treatment in a wet way with the addition of an organic binder to the powder, thereby providing a slurry, and this slurry was applied on one principal surface of the PTC substrate by applying a spin coating method at a rotation speed of 1500 rpm, thereby forming a raw NTC thick film of about 5 μm in thickness.

Next, the PTC substrate with the raw NTC thick film formed thereon was housed in a zirconia sagger, subjected to a binder removal treatment, and then subjected to a firing treatment at each temperature of approximately 1100° C., 1150° C., 1200° C., 1250° C., and 1300° C. as shown in the column "Firing Temperature for NTC Thick Film" in Table 1, thereby obtaining a sintered NTC thick film, and obtaining an element main body with the PTC substrate and NTC thick film integrated.

Then, an Ag paste was applied on the NTC thick film side of the element main body, and subjected to a baking treatment at a temperature of about 700° C. to form an electrode, then, the element main body was diced to have planar dimensions of approximately 2 mm×2 mm, and InGa was applied on the PTC substrate side of the element main body to form another electrode.

For the thus obtained semiconductor ceramic element according to each of samples 1 to 5, a constant voltage of 5 V was applied in the thickness direction of the element main body across the electrodes so as to have the PTC substrate and NTC thick film connected in series, thereby measuring the resistance-temperature characteristics. In this case, the measurement was carried out in each of the forward direction and reverse direction for the pn junction at the bonded interface between the PTC substrate and the NTC thick film.

Figure 7:
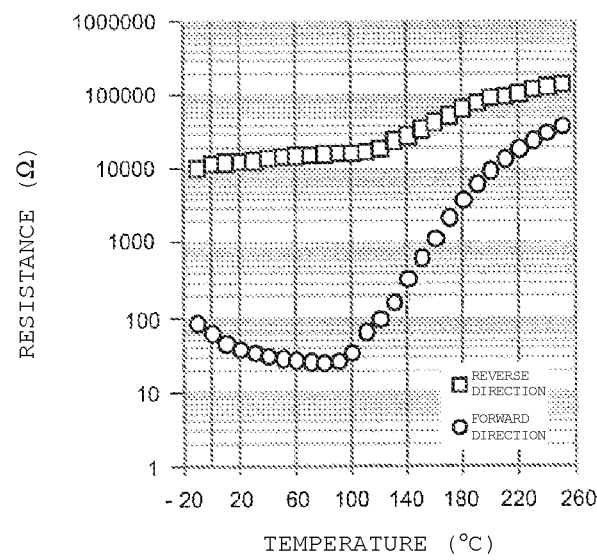
FIG. 7 is a diagram corresponding to FIG. 4, where resistance-temperature characteristics for an element main body according to a sample 2, which differs from the element main body according to the sample 1 as shown in FIG. 4 in terms of the treatment temperature for the NTC thick film, are compared in the case of forward electric current and in the case of reverse electric current.
Figure 8:
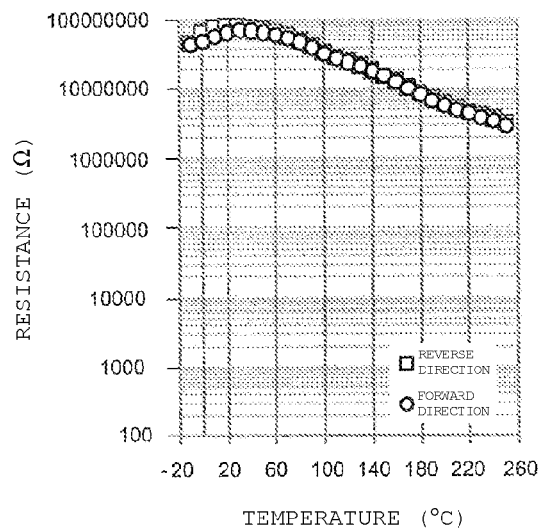
FIG. 8 is a diagram corresponding to FIGS. 4 and 7, where resistance-temperature characteristics for an element main body according to a sample 4, which differs from the element main bodies according to the sample 1 and the sample 2 as shown respectively in FIGS. 4 and 7 in terms of the treatment temperature for the NTC thick film, are compared in the case of forward electric current and in the case of reverse electric current.

FIG. 4 shows, as mentioned previously, resistance-temperature characteristics of the semiconductor ceramic element including the element main body according to the sample 1 are compared in the case of forward electric current and in the case of reverse electric current. The corresponding drawings are FIGS. 7 and 8, where FIG. 7 shows resistance-temperature characteristics of the semiconductor ceramic element including the element main body according to the sample 2, whereas FIG. 8 shows resistance-temperature characteristics of the semiconductor ceramic element including the element main body according to the sample 4.

In addition, concerning these resistance-temperature characteristics, the resistance values at, in particular, room temperature (20° C.) are shown in the respective columns "R20 in Forward Direction" and "R20 in Reverse Direction" in Table 1. Table 1 also shows the ratio of "R20 in Reverse Direction" to "R20 in Forward Direction", that is, "log (Reverse Direction R20/Forward Direction R20)".

Furthermore, for the cross section of the element main body according to each sample, elemental interdiffusion was evaluated by WDX (wavelength-dispersive X-ray spectroscopy) to confirm the elemental diffusion distances for Ti and Mn at the bonded interface between the PTC substrate and the NTC thick film. The results are shown in the column "Elemental Diffusion Distance" in Table 1.

about 1300° C., respectively, and these temperatures are lower than about 1350° C. as the "Firing Temperature for PTC Substrate", with a difference smaller than about 150° C. therebetween. These samples and 5 each have Mn and Ti diffused over the entire PTC substrate and the entire NTC thick film as can be seen from the "Element Diffusion Distance" in Table 1, and as a result, develop neither PTC characteristics or diode characteristics as can be seen from Table 1 and FIG. 7.

Experimental Example 2

In Experimental Example 2, for the Sr additive amount X in the PTC substrate composition: $(Ba_{0.997-X}SrE_{0.003})Ti_{1.010}O_3 + Si_{0.020}$, a sample 6 with X=0.100, a sample 7 with X=0.250, and a sample 8 with X=0.450 were prepared as shown in the column "Sr Additive Amount for PTC Substrate" in Table 2. In addition, the composition of the NTC thick film was adjusted to $(Mn_{1.4}Ni_{0.9}Fe_{0.7})O_4$ for these samples 6 to 8.

In addition, the firing temperature for obtaining the PTC substrate was adjusted to about 1350° C. as in the case of Experimental Example 1 as shown in the column "Firing Temperature for PTC Substrate" in Table 2, while the firing temperature for obtaining the sintered NTC thick film was standardized at about 1100° C. for all of the samples 6 to 8 as shown in the column "Firing Temperature for NTC Thick Film" in Table 2.

The other conditions were made as in the case of Experimental Example 1 to obtain a semiconductor ceramic element according to each of the samples 6 to 8.

TABLE 1

| Sample Number | Firing Temperature for PTC Substrate | Firing Temperature for NTC Thick Film | R20 in Forward Direction (KΩ) | R20 in Reverse Direction (KΩ) | log (Reverse Direction R20/ Forward Direction R20) | Elemental Diffusion Distance Ti | Elemental Diffusion Distance Mn |
|---|---|---|---|---|---|---|---|
| 1 | 1350° C. | 1100° C. | 0.032 | 15.2 | 2.68 | 2 μm | 2 μm |
| 2 |  | 1150° C. | 0.031 | 15.3 | 2.69 | 10 μm | 10 μm |
| 3 |  | 1200° C. | 0.032 | 15.6 | 2.69 | 50 μm | 50 μm |
| 4 |  | 1250° C. | 80205 | 90967 | 0.05 | 100 μm < | 100 μm < |
| 5 |  | 1300° C. | 86518 | 83143 | −0.02 | 100 μm < | 100 μm < |

The Samples 1 to 5 shown in Table 1 differ form each other only in "Firing Temperature for NTC Thick Film", under the other same conditions.

In the case of the samples 1 to 3, the "Firing Temperature for NTC Thick Film" falls within the range of about 1100° C. to about 1200° C., and these temperatures are lower than about 1350° C. as the "Firing Temperature for PTC Substrate" by about 150° C. or more. These samples 1 to 3 have short Ti and Mn diffusion distances of about 50 μm or less as can be seen from the "Element Diffusion Distance" in Table 1, and as a result, develop PTC characteristics and diode characteristics as can be seen from Table 1 as well as FIGS. 4 and 7.

Figure 9:
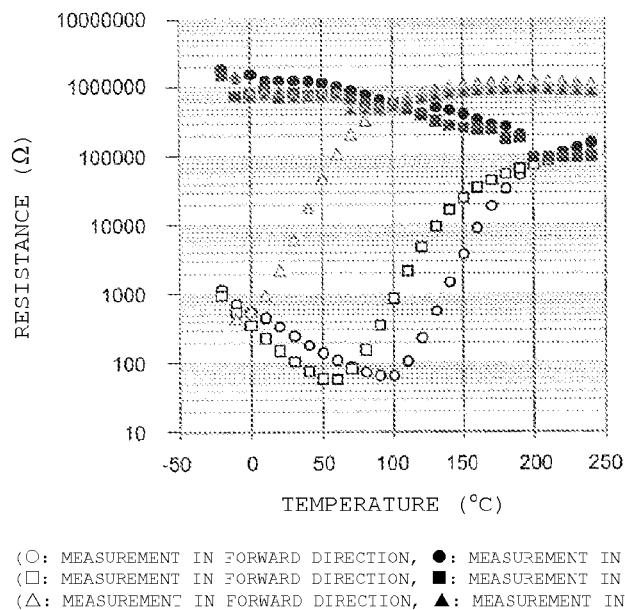
FIG. 9 is a diagram corresponding to FIG. 4, where resistance-temperature characteristics for respective element main bodies according to samples 6 to 8, which differ from the element main body according to the sample 1 as shown in FIG. 4 in terms of the composition of the PTC substrate, are compared in the case of forward electric current and in the case of reverse electric current.

In contrast, in the case of the samples 4 and 5, the "Firing Temperature for NTC Thick Film" is about 1250° C. and For the obtained semiconductor ceramic element according to each sample, the resistance-temperature characteristics were measured for each of the forward direction and reverse direction in the same way as in the case of Experimental Example 1. FIG. 9 shows resistance-temperature characteristics of the semiconductor ceramic element including the element main body according to each of the samples 6 to 8, which are compared in the case of forward electric current and in the case of reverse electric current.

In addition, concerning these resistance-temperature characteristics, the resistance values at, in particular, room temperature (about 20° C.) are shown in the respective columns "R20 in Forward Direction" and "R20 in Reverse Direction" in Table 2. Table 2 also shows the ratio of "R20 in Reverse Direction" to "R20 in Forward Direction", that is, "log (Reverse Direction R20/Forward Direction R20)".

TABLE 2

| Sample Number | Firing Temperature for PTC Substrate | Sr Additive Amount for PTC Substrate (mol) | Firing Temperature for NTC Thick Film | R20 in Forward Direction (KΩ) | R20 in Reverse Direction (KΩ) | log (Reverse Direction R20/ Forward Direction R20) |
|---|---|---|---|---|---|---|
| 6 | 1350° C. | 0.100 | 1100° C. | 0.34 | 1516 | 3.65 |
| 7 |  | 0.250 |  | 0.15 | 931 | 3.79 |
| 8 |  | 0.450 |  | 2.22 | 927 | 2.62 |

In the case of the samples 6 to 8, the "Firing Temperature for NTC Thick Film" is also lower than the "Firing Temperature for PTC Substrate" by about 150° C. or more as in the case of the samples 1 to 3 described previously. Therefore, the samples 6 to 8 also develop PTC characteristics and diode characteristics, as can be seen from Table 2 and FIG. 9.

This Experimental Example 2 was implemented for examining the effect in the case of varying the Sr additive amount in the composition of the PTC substrate.

In the case of a PTC element composed of only a PTC substrate, it is known that the Curie point is changed by the addition of Sr to the composition of the PTC ceramic. Further, in terms of allowing PTC elements to be mounted in various devices, it is important for various PTC elements which are different in rise temperature to be able to be provided by changing the Curie point. The same is also considered to be true in the case of the semiconductor ceramic element according to a preferred embodiment of the present invention.

On the other hand, in the case of the semiconductor ceramic element according to a preferred embodiment of the present invention, the combination of the PTC section and the NTC section then develops characteristics which are not achieved in the case of only a PTC substrate, such as (1) combined electrical characteristics including PTC characteristics and NTC characteristics and (2) the rectifying characteristics of the pn junction. If these characteristics (1) and (2) are not developed when the Curie point is varied, the semiconductor ceramic element according to a preferred embodiment of the present invention will be considered limited in application.

This Experimental Example 2 can confirm that the characteristics (1) and (2) mentioned above can be developed even in the case of changing the Sr additive amount in the composition of the PTC substrate and varying the Curie point.

While preferred embodiments of the present invention and modifications thereof have been described above, it is to be understood that variations and additional modifications will be apparent to those skilled in the art without departing from the scope and spirit of the present invention. The scope of the present invention, therefore, is to be determined solely by the following claims.

What is claimed is:

1. A semiconductor ceramic element comprising:
an element main body including a PTC section that includes a semiconductor ceramic with PTC characteristics and an NTC section including a semiconductor ceramic with NTC characteristics, the PTC section and the NTC section being integrated in direct contact with each other with a bonded interface interposed therebetween;
a first electrode provided on an outer surface of the element main body so as to contact the PTC section; and
a second electrode provided on the outer surface of the element main body so as to contact the NTC section; wherein
the semiconductor ceramic element has combined electrical characteristics including PTC characteristics and NTC characteristics; and
the NTC section includes a Mn-based spinel-type oxide.

2. The semiconductor ceramic element according to claim 1, wherein the PTC section includes a BaTiO$_3$-based oxide.

3. The semiconductor ceramic element according to claim 2, wherein a Ti interdiffusion distance at the bonded interface between the PTC section and the NTC section is about 50 µm or less.

4. The semiconductor ceramic element according to claim 1, wherein a Mn interdiffusion distance at the bonded interface between the PTC section and the NTC section is about 50 µm or less.

5. A semiconductor ceramic element comprising:
an element main body including a thick film including a semiconductor ceramic material defining a second conduction-type semiconductor ceramic disposed on a substrate that has been fired at a first temperature, and a semiconductor ceramic material defining a first conduction-type semiconductor ceramic and that has been fired at a second temperature lower than the first temperature;
a semiconductor ceramic which has PTC characteristics is one of the first and second conduction-type semiconductor ceramics and a semiconductor ceramic which has NTC characteristics is the other of the first and second conduction-type semiconductor ceramics;
a first electrode arranged on an outer surface of the element main body so as to contact the substrate; and
a second electrode arranged on the outer surface of the element main body so as to contact the thick film; wherein
the semiconductor ceramic element has combined electrical characteristics including PTC characteristics and NTC characteristics.

6. The semiconductor ceramic element according to claim 5, wherein the element main body includes a PTC section and an NTC section.

7. The semiconductor ceramic element according to claim 6, wherein the PTC section includes a BaTiO$_3$-based oxide.

8. The semiconductor ceramic element according to claim 6, wherein the NTC section includes a Mn-based spinel-type oxide.

9. The semiconductor ceramic element according to claim 7, wherein a Ti interdiffusion distance at the bonded interface between the PTC section and the NTC section is about 50 µm or less.

10. The semiconductor ceramic element according to claim 8, wherein a Mn interdiffusion distance at the bonded interface between the PTC section and the NTC section is about 50 µm or less.

11. A method for producing a semiconductor ceramic element, the method comprising the steps of:
obtaining a substrate by firing at first temperature a semiconductor ceramic material to serve as a first conduction-type semiconductor ceramic;
forming on the substrate a thick film including a semiconductor ceramic material to serve as a second conduction-type semiconductor ceramic; and
firing the thick film at a second temperature lower than the first temperature; wherein
a semiconductor ceramic which has PTC characteristics is one of the first and second conduction-type semiconductor ceramics and a semiconductor ceramic which has NTC characteristics is the other of the first and second conduction-type semiconductor ceramics.

12. The method according to claim 11, wherein the first conduction-type semiconductor ceramic comprises a $BaTiO_3$-based oxide, whereas the second conduction-type semiconductor ceramic comprises a Mn-based spinel-type oxide, and the second temperature is lower than the first temperature by about 150° C. or more.

13. The method according to claim 11, wherein the semiconductor ceramic element includes a PTC section and an NTC section.

14. The method according to claim 13, wherein the PTC section includes a $BaTiO_3$-based oxide.

15. The method according to claim 13, wherein the NTC section includes a Mn-based spinel-type oxide.

16. The method according to claim 14, wherein a Ti interdiffusion distance at the bonded interface between the PTC section and the NTC section is about 50 μm or less.

17. The method according to claim 15, wherein a Mn interdiffusion distance at the bonded interface between the PTC section and the NTC section is about 50 μm or less.

\* \* \* \* \*